United States Patent [19]
Gorin et al.

[11] Patent Number: 5,844,512
[45] Date of Patent: Dec. 1, 1998

[54] AUTORANGING APPARATUS AND METHOD FOR IMPROVED DYNAMIC RANGING IN ANALOG TO DIGITAL CONVERTERS

[75] Inventors: Joseph M. Gorin; Roger D. Sheppard, both of Santa Rosa, Calif.

[73] Assignee: Hewlett-Packard Company, Palo Alto, Calif.

[21] Appl. No.: 901,490

[22] Filed: Jul. 28, 1997

[51] Int. Cl.[6] ................................... H03M 1/18
[52] U.S. Cl. ........................... 341/139; 341/155
[58] Field of Search ..................... 341/139, 155, 341/132, 172, 110

[56] References Cited

U.S. PATENT DOCUMENTS 5,329,281  7/1994  Baumgartner et al. ............ 341/139

Primary Examiner—Brian Young
Attorney, Agent, or Firm—Jeffrey D. Wheeler

[57] ABSTRACT

An autoranging apparatus and method for an analog-to-digital converter (ADC) which uses a proposed gain detector including a peak of absolute detector and a quantizer to determine a proposed gain, and a amplifier gain setting rule processor in parallel with an anti-aliasing (AA) filter. The rule processor generates a current gain from inputs including the current gain, proposed gain, and a resolution bandwidth (RBW) value. The current gain is used to set a variable amplifier before the signal is sampled & held, and then converted to a digital word via the ADC. A variable band-pass filter can additionally be used before the AA filter to produce a pre-filtered signal. The pre-filtered signal would similarly be processed by the proposed gain detector. The resulting digital word is scaled down again through values stored in a look-up table. The look-up table is generated via a calibration routine which determines with certain precision the variable gain levels for the particular amplifier device used.

16 Claims, 4 Drawing Sheets

AUTORANGING APPARATUS AND METHOD FOR IMPROVED DYNAMIC RANGING IN ANALOG TO DIGITAL CONVERTERS

FIELD OF INVENTION

This invention relates to an autoranging apparatus which optimizes the dynamic range of an ADC without requiring allocation of more converter bits. The apparatus utilizes decision-making rules which set the signal gain in a variable amplifier during the signal path delay intentionally inserted or caused by an associated anti-aliasing filter.

BACKGROUND OF THE INVENTION

An intermediate frequency (IF) is generated by multiplying of an incoming signal of unknown frequency by a sinusoid of known frequency as generated by a local oscillator (LO). This multiplication operation shifts the unknown frequency up and down the spectrum by the frequency of the sinusoid. The difference between the LO frequency and the unknown frequency becomes the IF.

In the past, analog devices have been primarily used to process IF signals due to their overall availability and speed. Today, digital signal processing (DSP) has been increasingly integrated into the chain of associated receivers and analyzers, thereby replacing more and more of the analog functions. As a result, the burden of dynamic range performance falls increasingly on the ADC that converts the IF signal for digital processing. At direct current (DC) and low frequencies, ADCs with greater than 16 bits are available which have dynamic ranges in the order of 90 or more decibels (dB). However, the bandwidths available for processing are small due to the relatively slow sample rates. Relatedly, autoranging solutions at lower frequencies usually have adequate time to process and convert the incoming signals. For instance, when hundreds of microseconds (or more) are available, circuits can be designed to execute desired steps such as: determining signal levels, setting gain stages, allowing the stages to settle, and finally measuring the signal in light of its known range.

Accordingly, wider bandwidths are presently needed, particularly for communications systems which operate at higher frequencies. Faster ADCs provide wider bandwidths, but this presents a dilemma in that the faster ADCs typically don't have enough bits to provide sufficient dynamic range. ADCs with more and more bits increase exponentially in price. Faster ADCs can also be limited, for example, by such factors as: distortion terms at high signal levels due to linearity problems; quantization caused distortion; errors due to noise; and thermal noise due to the higher inherent bandwidths involved.

Moreover, as conversion times approach tens of nanoseconds, it becomes increasingly difficult to perform such operations as detecting the signal level, executing decision-making and setting the gain, allowing stages to settle, and then taking more data. With currently available technology, there is no practical way—in the span of one clock cycle at speeds faster than 10–20 MSa/s (million samples per second)—to perform the aforementioned measurement and conversion steps.

For instance, a typical bandwidth of 10 MHz, with an IF in the 1–21.4 MHz range requires an ADC with a sample rate of >=25.6 MSa/s. Equipment such as swept spectrum analyzers and receivers for spectrum monitoring, as well as operations such as demodulation of analog and digital communications formats, and stimulus-response measurements, typically need over 100 dB of dynamic range. Presently available ADCs utilize 12 bits, and this would limit the dynamic range from distortion and noise products to around 70 dB. Conversely, ADCs which utilize more bits prove to be too costly to use in most applications.

Accordingly, an ADC apparatus and method are needed for higher frequency signals which will provide a relatively higher dynamic range without increasing the number of bits used by the ADC. This apparatus and method should similarly reduce noise and eliminate distortion products in the IF.

SUMMARY OF THE INVENTION

The present invention provides for an autoranging apparatus and method which optimizes the dynamic range of an ADC without requiring the allocation of more ADC bits. The apparatus includes a selectable gain stage placed in front of the ADC. A peak detector, or envelope detector, is used to determine the optimum signal range by peak detection of the signal level. For large signals, the gain is removed and the signals are placed near the full scale of the ADC to utilize the optimum dynamic range. At lower signal levels, more and more gain is placed in front of the ADC, and the resulting ADC input repositioned to be optimally near the full scale of the ADC. The present invention finds useful application in devices including, but not limited to, the intermediate frequency stage of a receiver, such as a network or spectrum analyzer, that uses digital signal processing, usually for filtering or detection, in place of traditional analog processing. For swept digital IF applications, a digital IF is tuned to a single frequency which, when referred to the input of an instrument, sweeps over the desired frequency range of analysis. This is in contrast to an FFT-based (Fast Fourier Transform) digital IF.

The digital word resulting from the ADC is scaled downward proportional to the increase in signal level that was caused by placing more gain in front of the ADC. The absolute value of the signal is therefore correct. The signal to noise ratio (SNR) would normally be limited due to the ADCs lack of an inordinately expensive number of converter bits. The present invention, however, favorably scales such SNR limits, particularly for smaller signals where more dynamic range is needed. When considering the total signal measurement, the dynamic range has been improved by the gain placed in front of the ADC. This technique provides a real-time autoranging system which provides improved dynamic range that could not be achieved by using the ADC alone.

The present invention takes advantage of using the signal that is available before an anti-aliasing (AA) filter which has been placed in the main signal path. The AA filter has an extended group delay which delays the incoming signal for a large number of ADC sample clock cycles. The present invention uses the pre-delayed signal to therefore take advantage of looking at the signal ahead in time, before the adjusted signal has arrived at the ADC. The filter delay allows this technique to take an instant sample of the signal's level in one clock cycle, decide how to adjust the amplifier gain in the next clock cycle, and thereafter change the gain to allow the circuits to settle in the next clock cycle. The adjusted signal thereby arrives at the ADC with an optimum gain to maximize dynamic range. By looking ahead of the ADC and determining the value and range of the incoming signal, the present invention prevents the signal from overdriving and clipping the ADC. Accordingly, there is never a problem with overload. Moreover, given the group delay presented by the AA filter, these steps can be taken in a pipelined fashion instead of all in one clock cycle.

A related novel feature of the present invention is the implementation of intelligence, or rules, in the decisionmaking process as to how the autoranging is applied. Since the peak detected level of the incoming signal is known before the adjusted signal has arrived at the ADC, a set of processing rules can be applied based upon the signal characteristics. Such processing rules will vary depending upon the nature of the signal, the application being used, and the desired measurement results. Accordingly, the processing rules can determine what kind of attack, delay, and decay rates should be applied to a signal under a particular set of circumstances in order to minimize adverse effects. In the preferred embodiment, the intelligence or rule processing implementation is done in a programmable array of logic (PAL). Such implementation could also be accomplished with standard hard-coded logic, particularly where higher processing speeds are necessary. The PAL, or other implementation, can be programmed to decide the most efficient and beneficial response to signals where fast attacks or quick decays are encountered. Alternatively, the PAL can process signals where the envelope is modulated in a known fashion, but where it is not desired to follow that particular modulation rate.

Rapid modulation of the autoranging gain can lead to problems, however. This is particularly true when performing such measurements as third order intercept (TOI). In such a case, when the swept analyzer is tuned to the location of a TOI product, two tones in the IF are typically produced. The envelope of the IF signal can vary over 9 dB peak-to-peak (p-p) at a rate equal to the tone spacing, hence referred to as $f_{diff}$. If the autoranging gain were allowed to change synchronously with $f_{diff}$, any imperfections in that gain would cause sidebands on the left and right, or upper and lower frequency tones at a spacing of $f_{diff}$. These sidebands look just like TOI products, and even a small gain error can cause significant sidebands. Thus, whenever $f_{diff}$ is large enough for the final IF response to be well down the related filter boundaries, or skirt, the autoranging gain must be prevented from moving synchronously with $f_{diff}$. Accordingly, the processing rules of the present invention prevent an increase in gain for a set time period following any call for a increase in gain. This will cause the gain to not modulate when two tones are spaced apart greater than or equal to the reciprocal of this set time period. Moreover, if the tones are spaced more closely, then the skirts of the filter prevent the sidebands of modulation (e.g. false TOI products) from being visible.

Yet another advantage and feature of the present invention is its ability to accurately compensate for the gain levels that are applied by the amplifier in the analog signal path to thereby optimize the ADC result. The digital signal representation, which is outputted from the ADC, must be compensated to remove the gain level which was applied to the incoming signal to the ADC. While such gain levels might be applied through a variety of techniques, the present invention utilizes gain stages which are stepped in powers of two and are implemented with a R/2R resistive divider networks. Hence, to compensate in the digital domain, one solution would include shifting the digital bit representation of the signal either left or right as needed. This would achieve equivalent steps of multiplication or division by two for each bit shift, without the need for any further mathematical operations. However, the analog gain steps or stages will likely never be exact powers-of-two. Hence this approach is prone to errors that can produce sidebands, or other spurious signals into the measurement, due for instance to the switching of gain and the like.

The present invention solves this problem by providing a gain correction look-up table full of gain ranges. While it might be implemented in a variety of ways, the preferred embodiment stores this look-up table in a standard Random Access Memory (RAM) integrated circuit (IC). As such the gain range position code is used as part of the addressing input to the RAM, while the ADCs output bits provide the remainder of the addressing bits. Accordingly, the ADC digital output code bits, combined with the gain range code bits, are used to address stored pages of data. The stored data is pre-computed based upon a calibration scheme that corrects for the inexact powers-of-two in the gain stages of the analog circuitry. While this embodied look-up table compensates for gain stages producing steps with magnitudes of powers-of-two, the present technique could equally be applied to any gain step value implemented by hardware stages, or variable gain devices.

Other advantages and features of this invention will become apparent from the following description taken in conjunction with the accompanying drawings wherein are set forth, by way of illustration and example, certain embodiments of this invention. The drawings constitute a part of this specification and include exemplary embodiments of the present invention and illustrate various objects and features thereof.

BRIEF DESCRIPTION OF THE DRAWINGS

FIG. 5(b) shows a pair of corresponding voltage versus time plots produced during a TOI measurement.

DETAILED DESCRIPTION OF THE PREFERRED EMBODIMENT

Although the invention has been described in terms of several specific embodiments, it will be readily apparent to those skilled in this art that various modifications, rearrangements and substitutions can be made without departing from the spirit of the invention. The scope of the invention is defined by the claims appended hereto.

Figure 1:
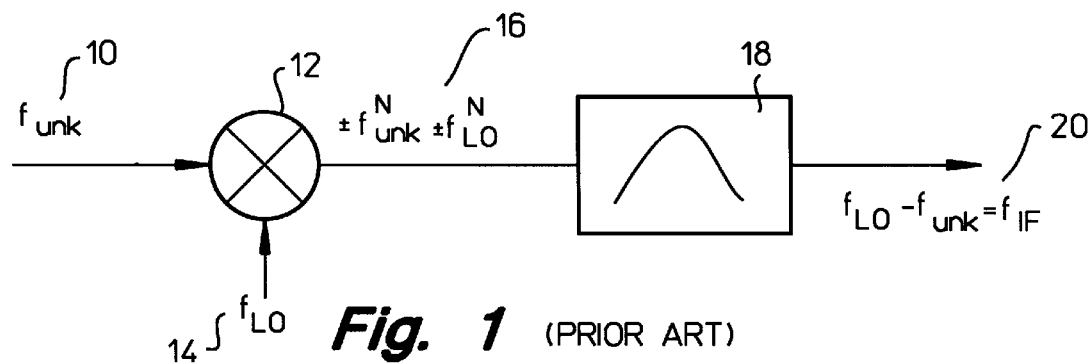
FIG. 1 shows a partial block diagram of the elements for forming an IF signal.

Referring now to FIG. 1, the formation of a typical IF signal is shown. An unknown frequency $f_{unk}$ 10 is fed into a sinusoidal multiplier 12 along with a known local oscillator (LO) frequency $f_{LO}$ 14. The resultant signal 16 is filtered from the relevant part of the signal spectrum via filter 18 to produce the $f_{IF}$ signal 20 equal to $f_{LO}$ minus $f_{unk}$.

Figure 2:
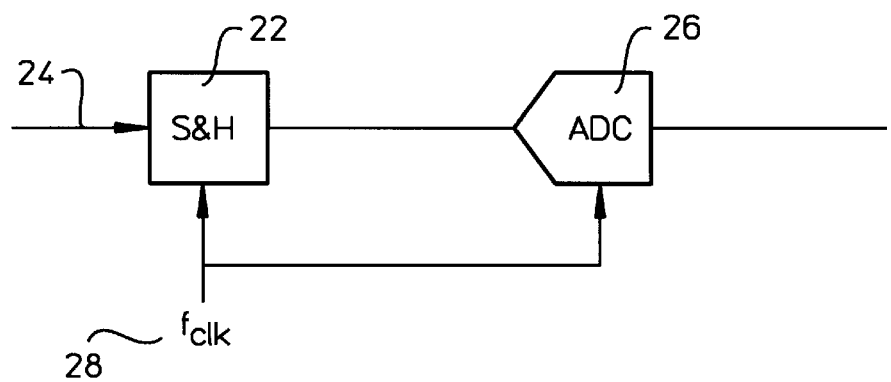
FIG. 2 shows a partial block diagram of the elements of prior art ADC circuitry without autoranging.

Referring now to FIG. 2, a portion of a block diagram is shown with a sample and hold device 22 for receiving the input signal 24. This allows signals produced by the ADC 26 to settle before the ADC receives and processes the next signal information. Such devices are controlled by a sample or clock frequency $f_{clk}$ input 28 which allows the circuitry to step, settle, and then take more data. Such sequential stepping generally prevents continuous data measurements as limited by the $f_{clk}$ sample spacing. The resulting $f_{IF}$ is usually given by the formula $((2N+1)/4)*f_{clk}$, where N is an integer 0, 1, 2, etc.

Figure 3:
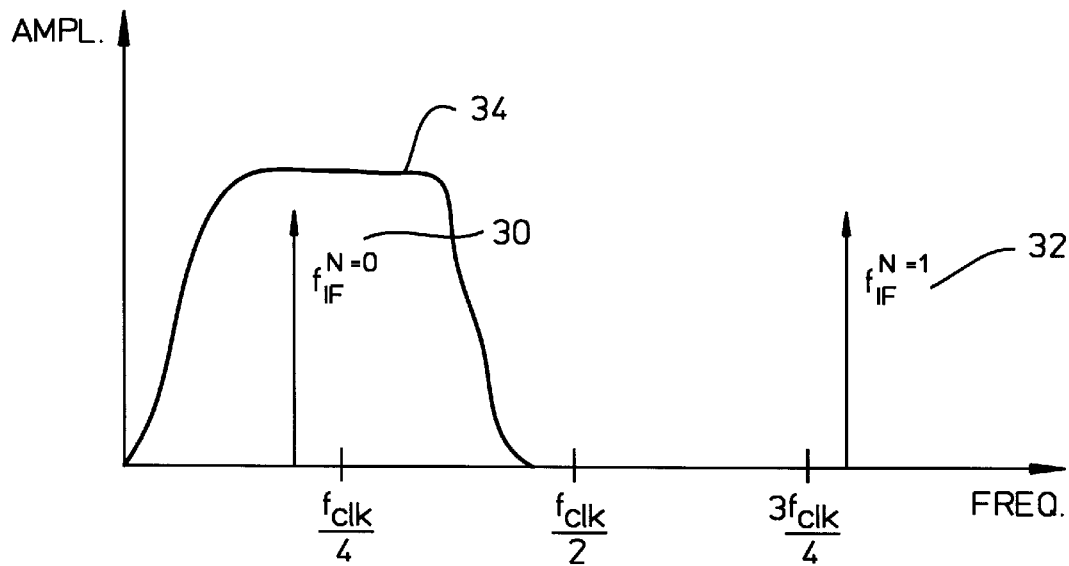
FIG. 3 shows an amplitude versus frequency plot of resulting IF signals.

Referring now to FIG. 3, an amplitude versus frequency plot is shown which demonstrates the occurrence of $f_{IF}$ ideally at $f_{clk}/4$ for N=0, and $3f_{clk}/4$ for N=1. As expected, however, the plot shows the $f_{IF}$ signals 30 and 32 as slightly offset from ideal. The best $f_{IF}$ for measurement purposes generally occurs at the lower end of the frequency scale at ¼ of $f_{clk}$. The present invention therefore uses a passband filter 34 centered at $f_{clk}/4$ to capture and process those signals relatively close to $f_{clk}/4$. The filter is also variable so that the passband can be readily adjusted as dependent upon the resolution bandwidth (RBW) used for any particular application. The resolution bandwidth is the overall bandwidth of the signal processing, both analog and digital. Normally it is the bandwidth over which the attenuation versus frequency is within 3 dB of the minimum attenuation.

Figure 4:
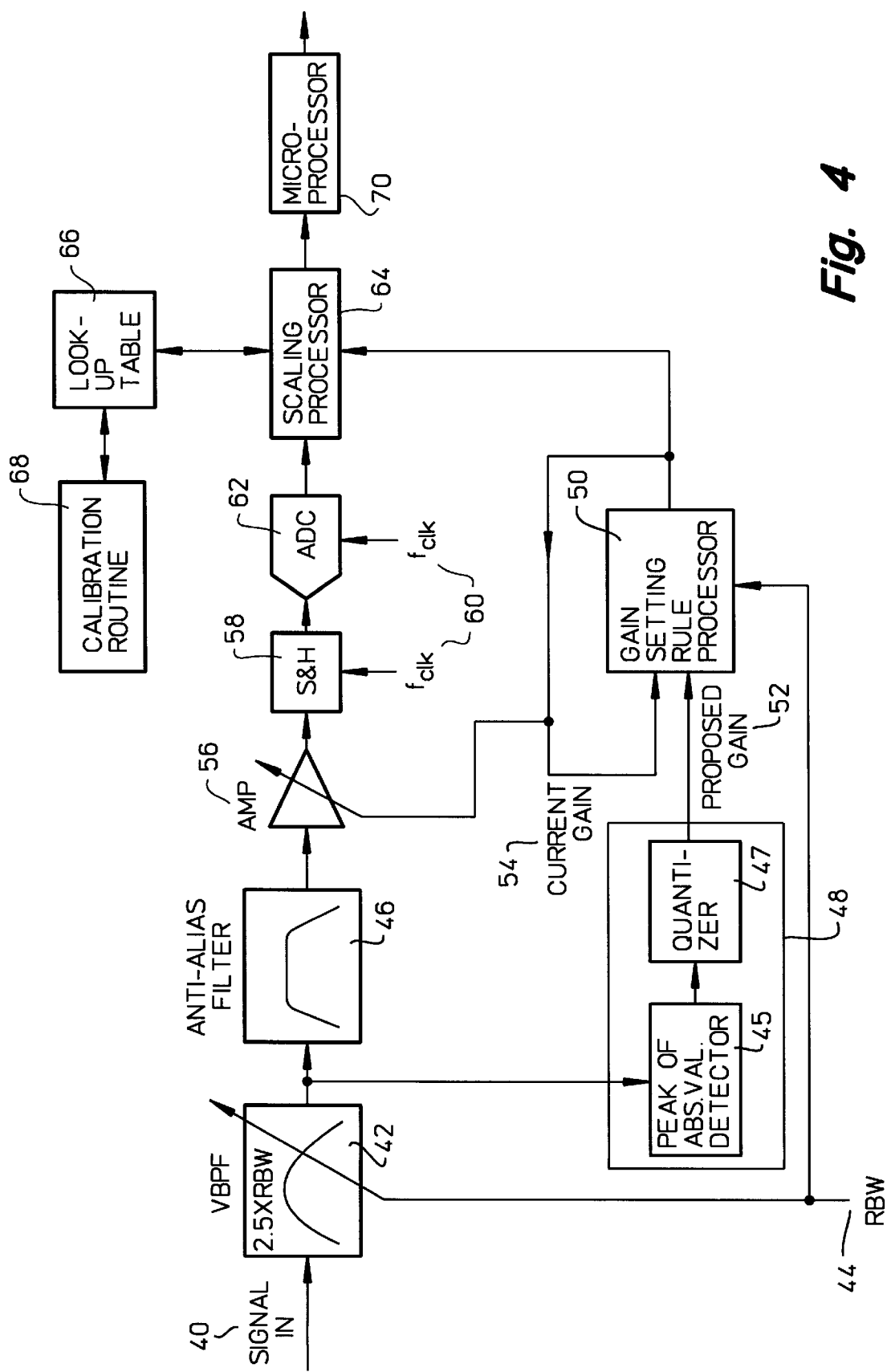
FIG. 4 shows a block diagram of the autoranging circuit of the present invention.

Referring now to FIG. 4, a block diagram is shown of the autoranging circuit. In this embodiment, the incoming signal 40 is pre-filtered by the variable bandpass filter (VBPF) 42. The width of the filter is controlled by the resolution bandwidth (RBW) 44. In this instance, the passband is set to 2.5 times RBW in order to eliminate any unwanted signals, and yet still pass the desired signals to be measured. While this pre-filter is found to be beneficial, it is not necessary for the remainder of the autoranging apparatus to function. Hence, the diagram of FIG. 4 might alternatively not include this VBPF. The filtering that implements the RBW occurs in block 70, where it will typically be implemented with custom digital hardware.

The pre-filtered signal next passes through an anti-aliasing (AA) filter 46 which is necessary before sampling the signal to prevent alias spurs from being generated. The anti-aliasing filter 46 adds a group delay which exceeds the minimum multiple of clock or sample cycles needed for the data conversion.

During this delay period, the pre-filtered signal is simultaneously routed to a proposed gain detector 48 which, in this instance contains a peak of absolute value detector 45 and a quantizer 47. The quantizer 47 might, for instance, include a comparator gain array, a flash ADC, or a thermometer code ADC. The proposed gain detector 48 thereby derives the peak of absolute value of the signal level and quantizes it for use as the proposed gain 52 by the gain setting rule processor 50. The rule processor 50 produces a current gain 54, which is fed back into the rule processor 50. The rule processor additionally inputs the RBW 44 and uses this to set a delay counter, as shown and explained for FIG. 6 below. The current gain 54 is therefore a function of the current gain 54, the proposed gain 52, and the RBW 44. The current gain 54 drives the variable amplifier 56. In the preferred embodiment, such an amplifier consists of gain stages which are stepped in powers of two and are implemented with known R/2R resistive divider networks. Other variable gain implementations, or gain staging techniques, are known and could readily be used without departing from the intended invention.

The compensated signal is fed into the sample and hold (S&H) device 58 which takes a new sample every clock cycle $f_{clk}$ 60 and then feeds this signal to the analog-to-digital converter (ADC) 62 which similarly processes a new conversion every clock cycle $f_{clk}$ 60. Hence, with the present invention, the proposed gain detector 48, along with the gain setting rule processor 50, operate in parallel with the delay caused by the AA filter 46. Accordingly, the gain of the amplifier 56 will be evaluated and set according to the characteristics of incoming signal.

Once converted, the digital signal is scaled via a scaling processor 64 which uses the current gain to locate a scaling factor stored in a look-up table 66. The scaling processor 64 might be implemented using, for instance, a shifter, multiplier, firmware, or software, with the chosen implementation providing adequate speed and optimum economy. The scaling processor 64 and look-up table 66 might also be implemented and considered as once element in FIG. 4. The preferred embodiment uses RAM storage, and a calibration routine 68 which measures and generates gain range levels for each of the network stages used. While the look-up table could be utilized in variety of ways, the particular embodiment uses the gain range position code as part of the addressing input to the RAM, while the ADC output bits provide the remainder of the addressing bits. Accordingly, the ADC digital output code bits, combined with the gain range code bits, are used to address stored pages of data in the look-up table. The stored data is pre-computed based upon the calibration scheme which corrects for inexact factors found in the particular implementation of gain staging. Examples of the type of corrections available with this embodiment in each page of the look-up table include, but are not limited to, gain stage errors for inexact powers-of-two or any other power, DC offsets of any gain stage, ADC coding conversions such as binary-to-two's complement, corrections for nonlinearities of the ADC in each page, and digital code randomization or de-randomization conversion. The resulting scaled digital signal is thereafter used by the connected application, e.g. a microprocessor 70, in any variety of systems or devices such as a swept spectrum analyzer and the like.

Figure 5A:
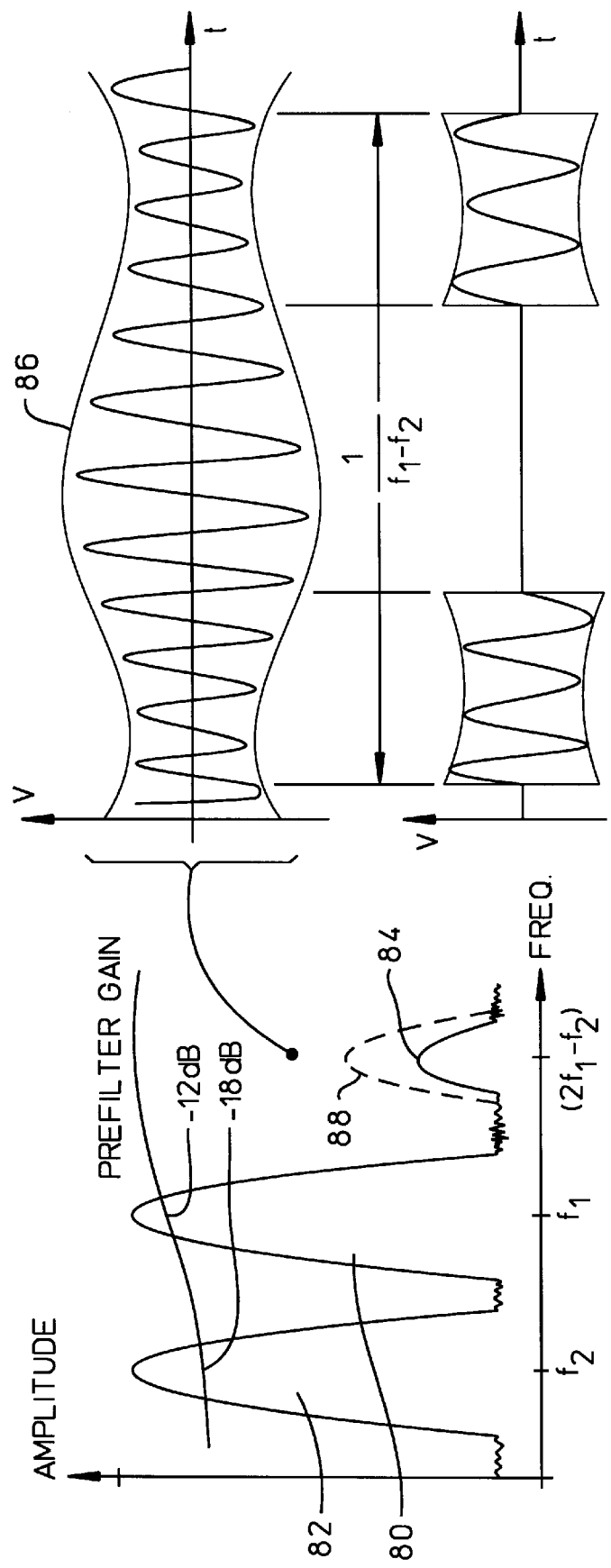
FIG. 5(a) shows an amplitude versus frequency plot of IF and sideband signals produced during a TOI measurement.

Referring now to FIGS. 5(a) and 5(b), a set of plots are shown which demonstrate some problems in performing Third-Order Intercept (TOI) measurements with a swept spectrum analyzer. In a TOI measurement, a device under test is driven by a pair of closely spaced tones in the IF of 80 and 82, centered respectively at $f_1$ and $f_2$. The device under test, due to its third-order non-linearities, generates distortion products at $2f_1-f_2$ and $2f_2-f_1$, with the upper product shown as 84. When the spectrum analyzer sweeps through that upper product, the signal received by the ADC is composed primarily from the two test tones, but attenuated by 12 and 18 dB as shown. Referring now to FIG. 5(b), with this combination of tones, the envelope 86 of the signal is 9 dB peak-to-peak for typical values of $f_{diff}$ (e.g. 3 to 15 times RBW), with a rate given by the difference in frequency $(f_1-f_2)$, and a period of $1/(f_1-f_2)$. If the autoranging is allowed to follow this envelope, small errors in gain between settings (for example 0.01 dB) can lead to large errors in apparent distortion products (for example −60 dBc). The error in gain acts to amplitude modulate (AM) the adjacent tone at a rate exactly required for placing the AM sideband where the TOI product belongs, shown in fathom as 88. As a result, the effective TOI of the IF, and thus the instrument, is degraded. Notably, the ability to accurately perform TOI measurements is generally considered to be an important spectrum analyzer feature.

To prevent this TOI occurrence, the autoranging rules are set so that the gain in front of the ADC cannot be increased for a period, given for instance by 1/(2.5× RBW), past the last instruction to either increase the gain, or to leave the gain the same. This will cause the gain to not modulate when the tones are spaced by 2.5 RBW or greater, thus preventing gain errors from looking like distortion products. If the tones are spaced more closely than that, the gain can follow the envelope, but the distortion product will be under the RBW skirt. This prevents sidebands of modulation (e.g. false TOI products) from being visible. The parameter 2.5 is meant to serve as part of an example embodiment, and not as a particular limitation of this invention. The parameter could easily be set to another value as appropriate for the particular application.

Figure 6:
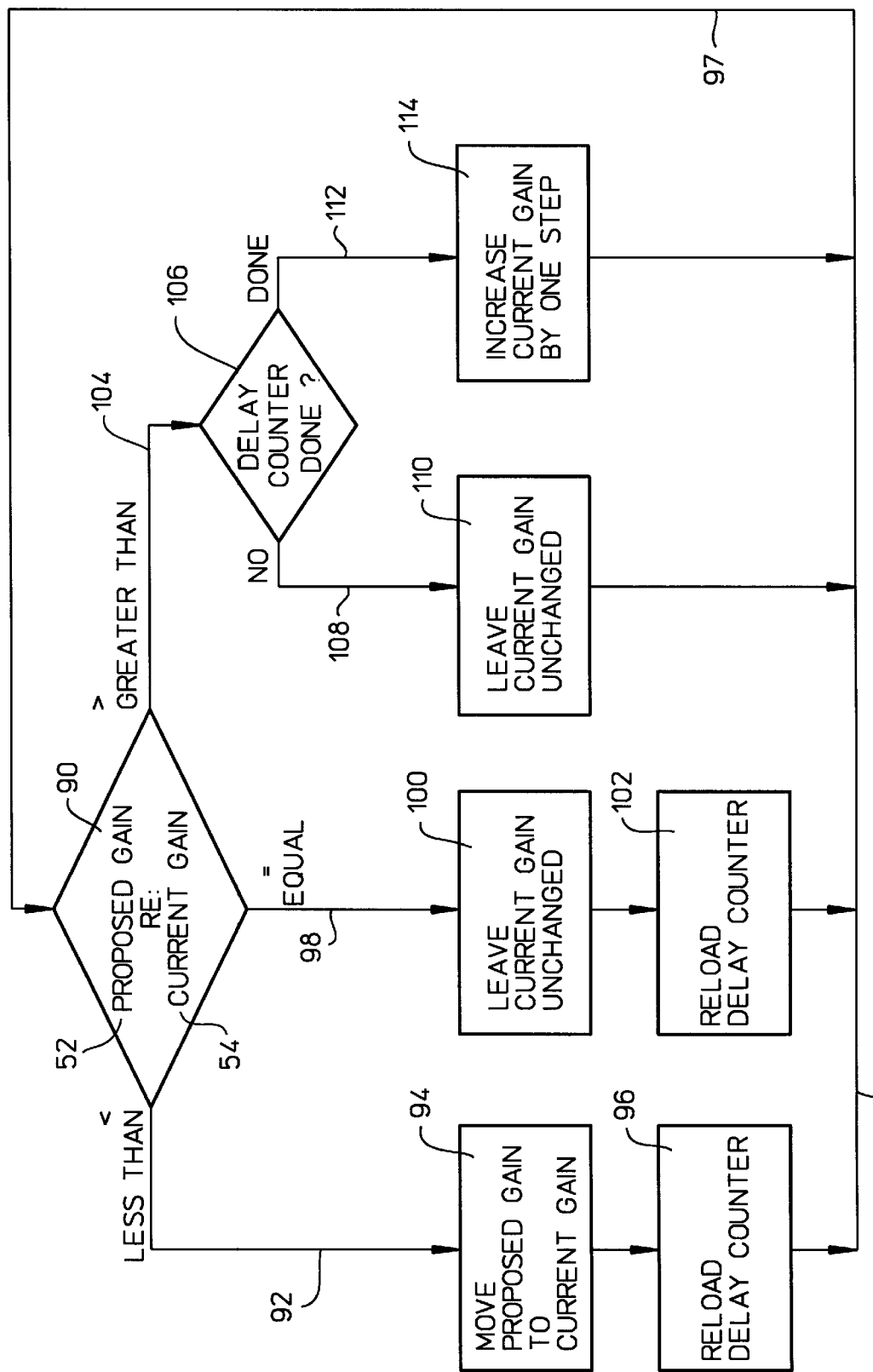
FIG. 6 shows a flow diagram of the steps involved in processing the gain settings to produce optimum results for certain measurements.

Referring also now to FIG. 6, a flow chart shows steps performed by the gain setting rule processor 50 above. A delay counter is used which is dependent upon the incoming RBW value 44. The counter is loaded with the difference between its terminal count (e.g. 1111 . . . 1 for a binary counter) and the number of ADC cycles in a given time period, for instance the prior embodied 1/(2.5× ⁻RBW). The RBW-dependent delay will usually be of the form $k_1 + f_{clk}/(k_2 * RBW)$, wherein $k_1$ will typically be 0 to 5 clock pulses, and $k_2$ will typically be between 1 and 4. This counter counts toward the terminal count on each conversion cycle as long as a proposed gain detector, or other such device for stepping up the gain, is requiring an increase in gain. When the counter reaches terminal count, it stops counting and allows a gain register to decline by one step, thereby increasing the gain by 2 (e.g. 6.02 dB) for this particular example embodiment, on each conversion cycle. Whenever the proposed gain detector, or other comparable device, asks for the same or lower gain, the counter resets to its starting-time value. The proposed gain detector for stepping the analog gain before conversion by the ADC could be implemented with other known hardware methods, and/or associated software, without departing from the intended invention.

As per FIG. 6, the incoming proposed gain 52 is compared with the current gain 54 and a decision is made in block 90. If the proposed gain is less than the current gain, as shown in path 92, then the current gain becomes the proposed gain, as shown in block 94. The counter is reloaded as per step 96 and the path returns via 97 to block 90 for the next comparison. If the proposed gain is equal to the current gain as per path 98, then the current gain is left unchanged as per step 100, and the counter is reloaded as per step 102, with the path returning control to block 90 via path 97 for the next comparison. The combined blocks 94–96, and 100–102 perform essentially the same function, and could be combined. They are shown here to more fully clarify the rule process applied. If the proposed gain is greater than the current gain as shown in path 104, then the delay counter is checked as per decision block 106. If the delay counter is not done as shown in path 108, then the current gain is left unchanged as per step 110, and control returns to block 90 via path 97. If the delay counter is done as shown in path 112, then the current gain is increased by one level as per step 114, with control returning again to block 90 via path 97.

It is to be understood that while a certain form of the invention is illustrated, it is not to be limited to the specific form or arrangement of parts herein described and shown. It will be apparent to those skilled in the art that various changes may be made without departing from the scope of the invention and the invention is not to be considered limited to what is shown in the drawings and descriptions.

What is claimed is:

1. An autoranging apparatus for optimally scaling inputs to an analog to digital converter (ADC) to thereby increase dynamic range, the apparatus comprising:

an anti-aliasing (AA) filter for receiving the incoming signal and producing an AA filtered signal;

an proposed gain detector for receiving in parallel the incoming signal, determining its peak of absolute value, and converting this value into a proposed gain;

a gain setting rule processor for receiving the proposed gain and a resolution bandwidth (RBW) value and outputting a current gain which is received again by the gain setting rule processor, the current gain determined by these inputs;

a variable amplifier means for receiving the current gain, setting a gain level, and producing an amplified signal from the AA filtered signal;

a sample and hold device for producing a sampled signal from the amplified signal at a clock sample frequency $f_{clk}$;

an ADC for converting the sampled signal to a digital word;

a look-up table comprised of scaling ranges stored in an accessible memory device; and a scaling processor for appropriately scaling the digital word, based upon the scaling ranges stored in the look-up table, to compensate for added gain.

2. The autoranging apparatus of claim 1, wherein the look-up table is generated by a calibration routine which determines and stores the gain compensation scaling levels for the amplifier used.

3. The autoranging apparatus of claim 1, wherein the proposed gain detector includes a peak of absolute value detector and a quantizer.

4. The autoranging apparatus of claim 1, wherein a variable bandpass filter (VBPF) is included before the AA filter for receiving the incoming signal and producing a pre-filtered signal, with the pre-filtered signal being received by the proposed gain detector instead of the incoming signal.

5. The autoranging apparatus of claim 4, wherein the VPBF receives the RBW value and sets the passband as a function of this value.

6. The autoranging apparatus of claim 5, wherein the passband width is set to 2.5 times RBW and centered at $f_{clk}/4$.

7. The autoranging apparatus of claim 1, wherein the gain setting rule processor sets a delay counter as a function of the RBW, the counter being loaded with the difference between its terminal count and the number of ADC cycles in a set time period.

8. The autoranging apparatus of claim 7, wherein the set time period is 1/(2.5×RBW).

9. The autoranging apparatus of claim 7, wherein the gain setting rule processor performs the following steps:

comparing the proposed gain to the current gain;

if the proposed gain is less than the current gain, setting the current gain to the proposed gain, reloading the delay counter, and returning control to the comparison step; or if the proposed gain is equal to the current gain, leaving the current gain unchanged, reloading the delay counter, and returning control to the comparison step; or if the proposed gain is greater than the current gain, checking the status of the delay counter: and if the delay counter is not done, leaving the current gain unchanged, and returning control to the comparison step; or if the delay counter is done, increasing the current gain by one known incremental step, and returning control to the comparison step.

10. The autoranging apparatus of claim 9, wherein the known incremental step is a power of two.

11. An autoranging method for optimally scaling inputs to an analog to digital converter (ADC) to thereby the increase dynamic range, the method including the steps of:

filtering an incoming signal with an anti-aliasing (AA) filter;

detecting the peak of the absolute value level of the incoming signal with a detector and using this value as a proposed gain;

generating a current gain setting from inputs including the current gain, the proposed gain, and a resolution bandwidth (RBW) value;

amplifying the filtered signal to produce an amplified signal using the current gain to set a variable amplifier;

sampling and holding the amplified signal at a clock sampling frequency $f_{clk}$ to produce a sampled signal;

converting the sampled signal to a digital word with an ADC;

scaling the digital word to compensate for the amplification.

12. The autoranging method of claim 11, wherein a pre-filtering step is added before the AA filtering step, comprising:

pre-filtering the incoming signal with a variable bandpass filter with a set passband to produce a pre-filtered signal;

wherein the detecting step operates on the pre-filtered signal instead of the incoming signal.

13. The autoranging method of claim 11, wherein the generating step further includes the steps of:

comparing the proposed gain to the current gain;

if the proposed gain is less than the current gain, setting the current gain to the proposed gain, reloading the delay counter, and returning control to the comparison step; or if the proposed gain is equal to the current gain, leaving the current gain unchanged, reloading the delay counter, and returning control to the comparison step; or if the proposed gain is greater than the current gain, checking the status of the delay counter: and if the delay counter is not done, leaving the current gain unchanged, and returning control to the comparison step; or if the delay counter is done, increasing the current gain by one known incremental step, and returning control to the comparison step.

14. The autoranging method of claim 13, wherein the incremental step is a power of two.

15. The autoranging method of claim 11, wherein the scaling step further includes the following steps:

using a look-up table containing the amplifier gain levels to determine the amount to scale down the digital word;

applying the scaling to the digital word.

16. The autoranging method of claim 15, wherein the look-up table is generated by a calibration routine which determines and stores the gain compensation scaling levels for the amplifier used.

* * * * *